(12) United States Patent
Zhou

(10) Patent No.: US 11,448,387 B2
(45) Date of Patent: Sep. 20, 2022

(54) LIGHT MODULE AND MOBILE TERMINAL

(71) Applicant: VIVO MOBILE COMMUNICATION CO., LTD., Guangdong (CN)

(72) Inventor: Feng Zhou, Guangdong (CN)

(73) Assignee: Vivo Mobile Communication Co., Ltd., Guangdong (CN)

( * ) Notice: Subject to any disclaimer, the term of this patent is extended or adjusted under 35 U.S.C. 154(b) by 0 days.

(21) Appl. No.: 17/467,824

(22) Filed: Sep. 7, 2021

(65) Prior Publication Data

US 2022/0026053 A1    Jan. 27, 2022

Related U.S. Application Data

(63) Continuation of application No. PCT/CN2020/077739, filed on Mar. 4, 2020.

(30) Foreign Application Priority Data

Mar. 7, 2019  (CN) .......................... 201910172883.7

(51) Int. Cl.
*F21V 23/04* (2006.01)
*F21V 23/00* (2015.01)

(52) U.S. Cl.
CPC ........ *F21V 23/0442* (2013.01); *F21V 23/003* (2013.01)

(58) Field of Classification Search
CPC ........................... F21V 23/0442; F21V 23/003
USPC ..................................................... 362/311.06
See application file for complete search history.

(56) References Cited

U.S. PATENT DOCUMENTS

| | | | | |
|---|---|---|---|---|
| 6,116,187 A | * | 9/2000 | Tabata | G02B 27/0018 |
| 7,569,802 B1 | * | 8/2009 | Mullins | H05B 47/11 |
| 9,776,560 B1 | * | 10/2017 | O'Neal | H05B 45/395 |
| 2001/0045524 A1 | * | 11/2001 | Fudoji et al. | F21Y 2113/13 |
| 2012/0025715 A1 | * | 2/2012 | Piiciotto | H05B 45/28 |
| 2012/0051377 A1 | | 3/2012 | Liang et al. | |
| 2012/0314410 A1 | * | 12/2012 | Leard | G01N 21/255 |
| 2013/0044444 A1 | * | 2/2013 | Creighton | G01J 1/0271 |
| 2014/0252249 A1 | * | 9/2014 | Doros | F21V 5/043 |

(Continued)

FOREIGN PATENT DOCUMENTS

| | | |
|---|---|---|
| CN | 107608167 A | 1/2018 |
| CN | 107870186 A | 4/2018 |

(Continued)

*Primary Examiner* — Bryon T Gyllstrom
(74) *Attorney, Agent, or Firm* — Price Heneveld LLP

(57) ABSTRACT

Disclosed are a light module and a mobile terminal. The light module includes: a support body, substrate, and light-transmitting element. The support body has a light path channel. The substrate is connected to the support body, is located at one end of the light path channel, and has a light source located in the light path channel. The light-transmitting element is connected to the support body, to seal an opening at the other end of the light path channel. A side face of the light-transmitting element that faces the light source has first and second electrical contact points, and a photosensitive coating capable of converting light energy into electrical energy; the first and second electrical contact points are electrically connected by the photosensitive coating, and are configured to connect to a detection module, so that the detection module detects a voltage across the first and second electrical contact points.

19 Claims, 3 Drawing Sheets

(56) References Cited

U.S. PATENT DOCUMENTS

2018/0084617 A1\* 3/2018 Zhang ...................... F21V 5/04
2018/0119897 A1   5/2018 Vogt et al.
2021/0038466 A1\* 12/2021 Mugan ................... F21S 8/085

FOREIGN PATENT DOCUMENTS

| CN | 207456385 U | 6/2018 |
|----|-------------|--------|
| CN | 108333850 A | 7/2018 |
| CN | 108767643 A | 11/2018 |
| CN | 108832475 A | 11/2018 |
| CN | 108879296 A | 11/2018 |
| CN | 109212763 A | 1/2019 |
| CN | 109751521 A | 5/2019 |

\* cited by examiner

LIGHT MODULE AND MOBILE TERMINAL

CROSS-REFERENCE TO RELATED APPLICATIONS

This application is a continuation application of PCT Application No. PCT/CN2020/077739 filed on Mar. 4, 2020, which claims priority to Chinese Patent Application No. 201910172883.7, filed on Mar. 7, 2019 in China, disclosures of which are incorporated herein by reference in their entireties.

TECHNICAL FIELD

This disclosure relates to the technical field of communication devices, and in particular, to a light module and a mobile terminal.

BACKGROUND

It is well known that a mobile terminal in the related art is typically provided with a light module, and a light source in the light module is typically a light-emitting diode LED or a laser chip. The light source is not allowed to emit light directly to the outside when the light source has a relatively strong light intensity. Therefore, a light-transmitting element is typically provided, and light rays emitted by the light source can enter the outside only after passing through the light-transmitting element. Generally, the light-transmitting element is directly exposed to the outside. If the light-transmitting element breaks, falls off, or shifts due to the falling of or impact on a mobile terminal, light rays emitted by the light source are likely to directly enter the outside, resulting in poor use safety of the light module.

SUMMARY

According to a first aspect, an embodiment of this disclosure provides a light module, including:
a support body, where the support body has a light path channel;
a substrate, where the substrate is connected to the support body and is located at one end of the light path channel, the substrate is provided with a light source, and the light source is located in the light path channel; and
a light-transmitting element, where the light-transmitting element is connected to the support body, so as to seal an opening at the other end of the light path channel, where
a side face of the light-transmitting element that faces towards the light source is provided with a first electrical contact point, a second electrical contact point, and a photosensitive coating capable of converting light energy of the light source into electrical energy, the first electrical contact point and the second electrical contact point are electrically connected by means of the photosensitive coating, and the first electrical contact point and the second electrical contact point are configured to connect to a detection module, so that the detection module detects a value of a voltage across the first electrical contact point and the second electrical contact point.

According to a second aspect, an embodiment of this disclosure further provides a mobile terminal, including a light module, a detection module, and a driver module configured to control light emission of a light source of the light module, where the driver module is electrically connected to the detection module;
the light module includes: a support body, where the support body has a light path channel;
a substrate, where the substrate is connected to the support body and is located at one end of the light path channel, the substrate is provided with the light source, and the light source is located in the light path channel; and
a light-transmitting element, where the light-transmitting element is connected to the support body, so as to seal an opening at the other end of the light path channel, where
a side face of the light-transmitting element that faces towards the light source is provided with a first electrical contact point, a second electrical contact point, and a photosensitive coating capable of converting light energy of the light source into electrical energy, the first electrical contact point and the second electrical contact point are electrically connected by means of the photosensitive coating, and the first electrical contact point and the second electrical contact point are configured to connect to the detection module, so that the detection module detects a value of a voltage across the first electrical contact point and the second electrical contact point.

BRIEF DESCRIPTION OF DRAWINGS

To describe the technical solutions in the embodiments of this disclosure more clearly, the following briefly describes the accompanying drawings required for describing the embodiments of this disclosure. Apparently, the accompanying drawings in the following description show merely some embodiments of this disclosure, and those of ordinary skill in the art can still obtain other drawings from these accompanying drawings.

DESCRIPTION OF EMBODIMENTS

The following clearly describes the technical solutions in the embodiments of this disclosure with reference to the accompanying drawings in the embodiments of this disclosure. Apparently, the described embodiments are some rather than all of the embodiments of this disclosure. All other embodiments obtained by a person of ordinary skill in the art based on the embodiments of this disclosure shall fall within the protection scope of this disclosure.

Unless otherwise defined, the technical terms or scientific terms used in this disclosure should have general meanings understood by a person of ordinary skill in the field to which this disclosure pertains. "First", "second", and like words used in this disclosure do not indicate any order, quantity, or importance, but are merely used to distinguish between different components. Similarly, "a" or "an" or like words do not indicate a quantitative limitation, but indicate at least one. "Connect" or "connected" or like words are not limited to a physical or mechanical connection, but may include an electrical connection, whether direct or indirect. "Up", "down", "left", "right", and the like are merely used to indicate a relative positional relationship, and the relative positional relationship changes accordingly when an absolute position of the described object changes.

Figure 1:
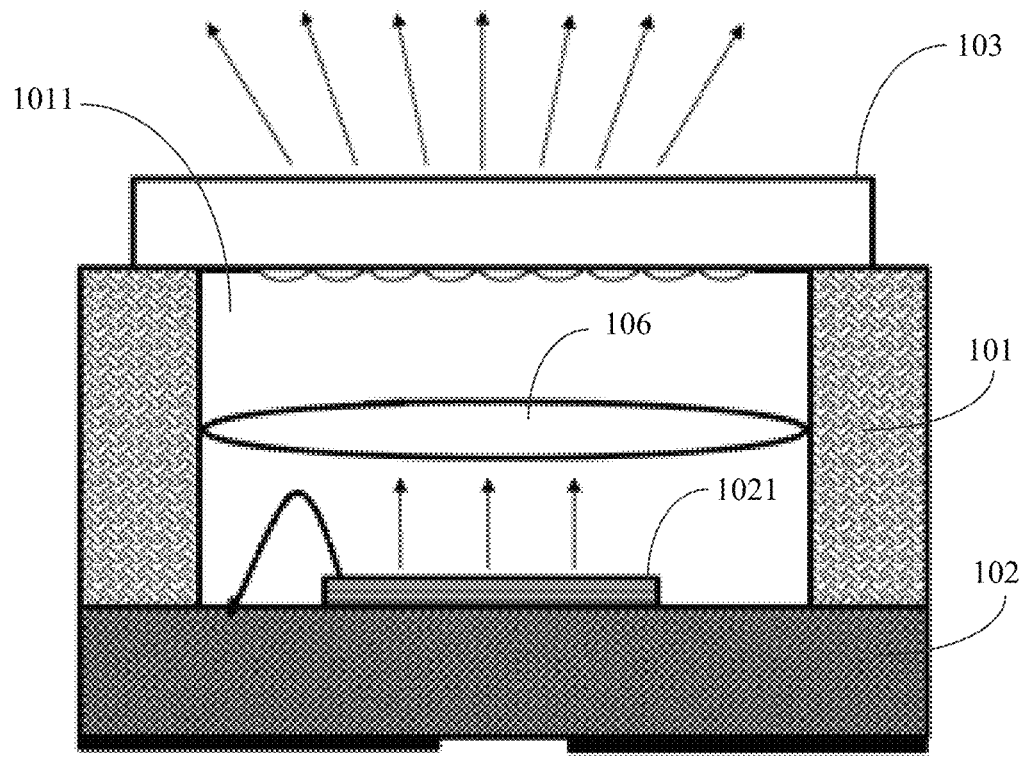
FIG. 1 is a structural diagram of a light module according to an embodiment of this disclosure.
Figure 2:
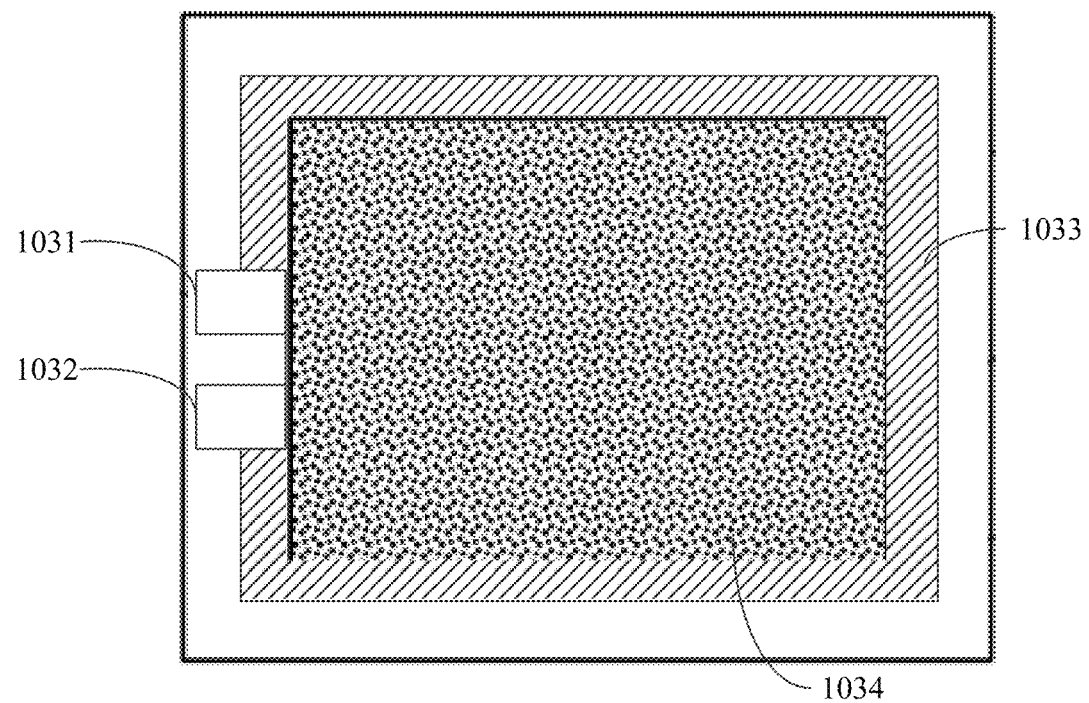
FIG. 2 is a structural diagram of a light-transmitting element in a light module according to an embodiment of this disclosure.
Figure 3:
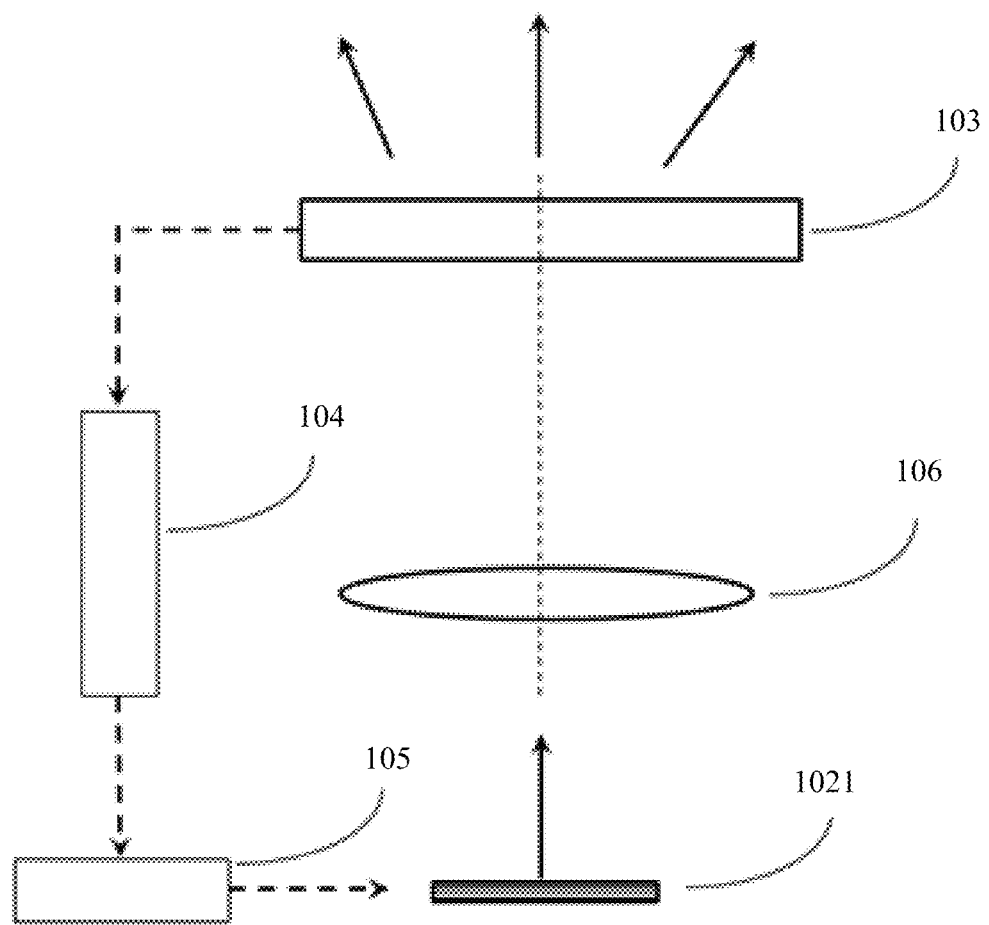
FIG. 3 is a schematic diagram of light emission control for a light source in a mobile terminal according to an embodiment of this disclosure.

With reference to FIG. 1 to FIG. 3, an embodiment of this disclosure provides a light module, including:

a support body 101, where the support body 101 has a light path channel 1011;

a substrate 102, where the substrate 102 is connected to the support body 101 and is located at one end of the light path channel 1011, the substrate 102 is provided with a light source 1021, and the light source 1021 is located in the light path channel 1011; and a light-transmitting element 103, where the light-transmitting element 103 is connected to the support body 101, so as to seal an opening at the other end of the light path channel 1011, where a side face of the light-transmitting element 103 that faces towards the light source 1021 is provided with a first electrical contact point 1031, a second electrical contact point 1032, and a photosensitive coating 1033 capable of converting light energy of the light source into electrical energy, the first electrical contact point 1031 and the second electrical contact point 1032 are electrically connected by means of the photosensitive coating 1033, and the first electrical contact point 1031 and the second electrical contact point 1032 are configured to connect to a detection module 104, so that the detection module 104 detects a value of a voltage across the first electrical contact point 1031 and the second electrical contact point 1032.

It should be noted that in an optional embodiment, the foregoing detection module may be provided on the foregoing substrate 102; in another optional embodiment, the foregoing detection module may alternatively be an external detection module, and the external detection module is a component in a mobile terminal other than the light module, for example, may be a part of a circuit of a main board of the mobile terminal, which is not further limited herein.

The foregoing light module may be applied in different scenarios. In this embodiment, the foregoing light module may be a floodlight module. A structure of the foregoing light source 1021 may be set based on actual requirements. For example, the light source 1021 may be a laser chip or a light-emitting diode. The laser chip may be a vertical-cavity surface-emitting laser (VCSEL) or a laser diode (LD). The light-emitting diode may be an infrared LED. In the following embodiments, a detailed description is provided by using an example in which the light source 1021 is a vertical-cavity surface-emitting laser.

The foregoing substrate 102 may be a substrate for packaging the vertical-cavity surface-emitting laser. The substrate is provided with a circuit structure inside and may be electrically connected to the light source 1021. The light source 1021 may be connected to a driver module 105 by means of the substrate 102, and light emission of the light source is controlled by the driver module 105.

The foregoing support body 101 may be a hollow structure having openings at both ends, and the hollow part forms the light path channel 1011. Specifically, a shape of the support body 101 may be set based on actual requirements, as long as the support body 101 can support the light-transmitting element 103.

In this embodiment of this disclosure, the foregoing support body 101 may be fixedly bonded to the light-transmitting element 103. A connection relationship between the foregoing support body 101 and the substrate 102 may be set based on actual requirements. For example, in an optional embodiment, the support body 101 and the substrate 102 may be integrally formed. In other embodiments, an adhesive may alternatively be provided for fixed bonding.

Specifically, during normal use, the driver module may control the light source 1021 to emit light. Light rays from the light source 1021 are incident on a surface of the light-transmitting element 103 through the light path channel 1011, and then enter the outside after passing through the light-transmitting element 103. In this case, the foregoing detection module 104 may detect that the first electrical contact point 1031 and the second electrical contact point 1032 are electrically connected by means of the photosensitive coating 1033. When the light-transmitting element 103 breaks or falls off, the detection module 104 detects that the electrical connection between the first electrical contact point 1031 and the second electrical contact point 1032 is disconnected, with a voltage being 0. When the light-transmitting element 103 shifts, an area of the photosensitive coating 1033 in the light path channel 101 changes, and the detection module 104 detects that a voltage across the first electrical contact point 1031 and the second electrical contact point 1032 increases or decreases. In this case, the detection module 104 may output a control signal to the driver module 105, to control the detection module 104 to turn off the light source 1021, such that the light source 1021 stops emitting light. In this way, direct emission of light rays from the light source 1021 can be avoided, thereby improving use safety of the light module.

In this embodiment of this disclosure, the photosensitive coating 1033 is provided on the light-transmitting element 103 so as to connect to the first electrical contact point 1031 and the second electrical contact point 1032, and when the light-transmitting element 103 breaks, falls off, or shifts, the detection module 104 detects an abnormal voltage across the first electrical contact point 1031 and the second electrical contact point 1032, and the driver module 105 controls the light source to stop emitting light, thereby effectively avoiding direct emission of light rays from the light source 1021. Therefore, the light module provided in the embodiments of this disclosure improves use safety of the light module.

A position of the foregoing photosensitive coating may be set based on actual requirements. For example, in an optional embodiment, at least part of the region of the photosensitive coating is located in the light path channel 1011.

In this way, the part of the photosensitive coating that is in the light path channel 1011 may be radiated by the light source, so that light energy can be converted into electrical energy, and a voltage across the first electrical contact point 1031 and the second electrical contact point 1032 is generated. In this embodiment, whether the light-transmitting element 103 is intact may be determined by monitoring, by the detection module 104, an electrical signal between the first electrical contact point 1031 and the second electrical contact point 1032. For example, in this embodiment, the foregoing detection module may be implemented by including a resistor and a control chip. Two ends of the resistor may be directly connected between the first electrical contact point 1031 and the second electrical contact point 1032. The control chip may perform detection for a voltage across the two ends of the resistor. When the light source 1021 is in a light emitting state, if the detection module 104 detects that the voltage is 0, it may be determined that the light-transmitting element 103 is damaged. Certainly, in other embodiments, other detection methods may alternatively be used for detection, and are not described herein one by one.

It should be noted that the foregoing detection module 104 and the driver module 105 may be designed based on dimension requirements of the light module. For example, in an optional embodiment, the detection module 104 and the driver module 105 may be arranged inside the light module. In another optional embodiment, the detection module 104 and the driver module 105 may alternatively be arranged outside the light module, or may be arranged near the light module.

Specifically, a manner in which the first electrical contact point 1031 and the second electrical contact point 1032 are connected to the detection module 104 may be set based on actual requirements. For example, in this embodiment, the foregoing light module further includes a first conducting wire and a second conducting wire, where one end of the first conducting wire is connected to the first electrical contact point, and the other end of the first conducting wire is electrically connected to the detection module; and one end of the second conducting wire is connected to the second electrical contact point, and the other end of the second conducting wire is electrically connected to the detection module.

In an optional embodiment, the first conducting wire and the second conducting wire may be provided on the support body 101. Specifically, the first conducting wire forms a first electrical connection point at an end of the support body 101 that faces towards the light-transmitting element 103, and the first electrical connection point is electrically connected to the first electrical contact point; and the second conducting wire forms a second electrical connection point at the end of the support body 101 that faces towards the light-transmitting element 103, and the second electrical connection point is electrically connected to the second electrical contact point.

In this embodiment, parts of the first conducting wire and the second conducting wire other than the first electrical connection point and the second electrical connection point may be provided on inner and outer surfaces of a side wall of the support body 101, or may be provided inside a side wall of the support body 101, which is not further limited herein. In this embodiment, the first electrical contact point and the second electrical contact point are electrically connected to the substrate by means of the first conducting wire and the second conducting wire, respectively, and then are electrically connected to the detection module 104 by means of the substrate. Because the first conducting wire and the second conducting wire are provided on the support body 101, the electrical connection between the first electrical contact point 1031 and the second electrical contact point 1032, and the detection module 104 is implemented, which is simple in structure and easy to mount.

Further, based on the foregoing embodiment, in this embodiment, a region that corresponds to the light path channel 1011 and that is on the side face of the light-transmitting element 103 that faces towards the light source is a light-transmitting region, the light-transmitting region is provided with an optical structure region 1034 and at least part of the region of the photosensitive coating 1033, and the photosensitive coating 1033 and the optical structure region 1034 do not overlap.

The foregoing optical structure region 1034 is usually provided with a specific optical structure for diffusing a small-angle laser beam emitted by the laser chip, into a uniform large-angle light surface or spot, that is, the optical structure region functions to diverge a light beam. A laser originally having good directivity and concentrated energy has reduced energy density after being diffused by the light-transmitting element, making the light module a product that meets safety specifications. Specifically, a size and structure of the optical structure region 1034 may be set based on actual requirements, which is not further limited herein.

It should be noted that a shape of the photosensitive coating 1033 may be set based on actual requirements. As shown in FIG. 2, in this embodiment, the photosensitive coating 1033 is provided in a strip shape. Specifically, in an optional embodiment, the first electrical contact point 1031 and the second electrical contact point 1032 are located on a same side of the optical structure region 1034, and the photosensitive coating 1033 is provided around the optical structure region 1034.

In FIG. 2, the foregoing photosensitive coating 1033 is provided substantially in a "C" shape. In this way, the optical structure region 1034 is not affected, and in addition, comprehensiveness of checking whether the light-transmitting element 103 is broken can be improved.

Moreover, the first electrical connection point and the second electrical connection point may be metal connecting sheets. To improve contact reliability, the metal connecting sheets may be provided to be elastically connected to the support body 101, such that after the light-transmitting element 103 is mounted and fixed, the metal connecting sheets can abut against the respective electrical contact points, thereby implementing the electrical connection.

Further, based on the foregoing embodiment, in this embodiment, the first electrical contact point 1031 and the second electrical contact point 1032 are both metal conducting plates.

The metal conducting plate may be provided as a square plate, and a side length of the metal conducting plate may be greater than a width of the photosensitive coating 1033, so as to facilitate contact with the first electrical connection point and the second electrical connection point.

It should be noted that to improve a light emitting effect of a light ray, in this embodiment, a collimating element 106 may further be provided in the foregoing light path channel 1011. The collimating element 106 is a lens that can convert incident light rays into substantially parallel emergent light rays. In this way, uniformity of light from the light module can be improved.

Further, an embodiment of this disclosure further provides a mobile terminal, and the mobile terminal includes the foregoing light module, a detection module, and a driver module configured to control light emission of the light source of the light module, where the detection module is electrically connected to the first electrical contact point and the second electrical contact point in the light module; and the driver module is electrically connected to the detection module.

In this embodiment, for implementation of structures and functions of the foregoing light module, the detection module, and the driver module, reference may be made to the foregoing embodiment, and details are not described herein again. Because the light module in the foregoing embodiment is used, the mobile terminal provided in this embodiment of this disclosure has all the beneficial effects of the foregoing light module.

The foregoing descriptions are merely embodiments of this disclosure, but the protection scope of this disclosure is not limited thereto. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A light module, comprising:
   a support body, wherein the support body has a light path channel;
   a substrate, wherein the substrate is connected to the support body and is located at one end of the light path channel, the substrate is provided with a light source, and the light source is located in the light path channel; and
   a light-transmitting element, wherein the light-transmitting element is connected to the support body, so as to seal an opening at the other end of the light path channel; wherein
   a side face of the light-transmitting element that faces towards the light source is provided with a first electrical contact point, a second electrical contact point, and a photosensitive coating capable of converting light energy of the light source into electrical energy, the first electrical contact point and the second electrical contact point are electrically connected by the photosensitive coating, and the first electrical contact point and the second electrical contact point are configured to connect to a detection module, so that the detection module detects a value of a voltage across the first electrical contact point and the second electrical contact point; and
   the light module stops emitting light in a case that the value of the voltage is detected to be abnormal.

2. The light module according to claim 1, wherein the detection module is provided on the substrate, or the detection module is an external detection module.

3. The light module according to claim 1, wherein the photosensitive coating is at least partially located in the light path channel.

4. The light module according to claim 1, further comprising a first conducting wire and a second conducting wire, wherein one end of the first conducting wire is connected to the first electrical contact point, and the other end of the first conducting wire is electrically connected to the detection module; and one end of the second conducting wire is connected to the second electrical contact point, and the other end of the second conducting wire is electrically connected to the detection module.

5. The light module according to claim 4, wherein the first conducting wire and the second conducting wire are provided on the support body, wherein the first conducting wire forms a first electrical connection point at an end of the support body that faces towards the light-transmitting element, and the first electrical connection point is electrically connected to the first electrical contact point; and the second conducting wire forms a second electrical connection point at the end of the support body that faces towards the light-transmitting element, and the second electrical connection point is electrically connected to the second electrical contact point.

6. The light module according to claim 1, wherein a region that corresponds to the light path channel and that is on the side face of the light-transmitting element that faces towards the light source is a light-transmitting region, the light-transmitting region is provided with an optical structure region and at least part of the region of the photosensitive coating, and the photosensitive coating and the optical structure region do not overlap.

7. The light module according to claim 6, wherein the photosensitive coating is provided in a strip shape.

8. The light module according to claim 7, wherein the first electrical contact point and the second electrical contact point are located on a same side of the optical structure region, and the photosensitive coating is provided around the optical structure region.

9. The light module according to claim 1, wherein the light source is a laser chip or a light-emitting diode.

10. The light module according to claim 1, wherein a region that corresponds to the light path channel and that is on the side face of the light-transmitting element that faces towards the light source is a light-transmitting region, the light-transmitting region is provided with at least part of the region of the photosensitive coating.

11. A mobile terminal, comprising a light module, a detection module, and a driver module configured to control light emission of a light source of the light module, wherein the driver module is electrically connected to the detection module; and
    the light module comprises:
    a support body, wherein the support body has a light path channel;
    a substrate, wherein the substrate is connected to the support body and is located at one end of the light path channel, the substrate is provided with the light source, and the light source is located in the light path channel; and
    a light-transmitting element, wherein the light-transmitting element is connected to the support body, so as to seal an opening at the other end of the light path channel; wherein
    a side face of the light-transmitting element that faces towards the light source is provided with a first electrical contact point, a second electrical contact point, and a photosensitive coating capable of converting light energy of the light source into electrical energy, the first electrical contact point and the second electrical contact point are electrically connected by the photosensitive coating, and the first electrical contact point and the second electrical contact point are configured to electrically connect to the detection module, so that the detection module detects a value of a voltage across the first electrical contact point and the second electrical contact point;
    the detection module outputs a control signal to the driver module in a case that the value of the voltage is detected to be abnormal; and
    the detection module turns off the light source of the light module in response to the control signal, such that the light module stops emitting light.

12. The mobile terminal according to claim 11, wherein the photosensitive coating is at least partially located in the light path channel.

13. The mobile terminal according to claim 11, wherein the light module further comprises a first conducting wire and a second conducting wire, wherein one end of the first conducting wire is connected to the first electrical contact point, and the other end of the first conducting wire is electrically connected to the detection module; and one end of the second conducting wire is connected to the second electrical contact point, and the other end of the second conducting wire is electrically connected to the detection module.

14. The mobile terminal according to claim 13, wherein the first conducting wire and the second conducting wire are provided on the support body, wherein the first conducting wire forms a first electrical connection point at an end of the support body that faces towards the light-transmitting element, and the first electrical connection point is electrically connected to the first electrical contact point; and the second conducting wire forms a second electrical connection point at the end of the support body that faces towards the light-transmitting element, and the second electrical connection point is electrically connected to the second electrical contact point.

15. The mobile terminal according to claim 11, wherein a region that corresponds to the light path channel and that is on the side face of the light-transmitting element that faces towards the light source is a light-transmitting region, the light-transmitting region is provided with an optical structure region and at least part of the region of the photosensitive coating, and the photosensitive coating and the optical structure region do not overlap.

16. The mobile terminal according to claim 15, wherein the photosensitive coating is provided in a strip shape.

17. The mobile terminal according to claim 16, wherein the first electrical contact point and the second electrical contact point are located on a same side of the optical structure region, and the photosensitive coating is provided around the optical structure region.

18. The mobile terminal according to claim 11, wherein the light source is a laser chip or a light-emitting diode.

19. The mobile terminal according to claim 11, wherein a region that corresponds to the light path channel and that is on the side face of the light-transmitting element that faces towards the light source is a light-transmitting region, the light-transmitting region is provided with at least part of the region of the photosensitive coating.

* * * * *